(12) United States Patent
Zhan et al.

(10) Patent No.: US 12,713,934 B2
(45) Date of Patent: Aug. 18, 2026

(54) FIRST CHIP AND WAFER BONDING METHOD AND CHIP STACKING STRUCTURE

(71) Applicant: WUHAN XINXIN SEMICONDUCTOR MANUFACTURING CO., LTD., Wuhan (CN)

(72) Inventors: Di Zhan, Wuhan (CN); Tianjian Liu, Wuhan (CN); Tian Zeng, Wuhan (CN); Wanli Guo, Wuhan (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 541 days.

(21) Appl. No.: 18/252,490

(22) PCT Filed: Feb. 25, 2021

(86) PCT No.: PCT/CN2021/077988
§ 371 (c)(1),
(2) Date: May 10, 2023

(87) PCT Pub. No.: WO2022/099949
PCT Pub. Date: May 19, 2022

(65) Prior Publication Data
US 2024/0021559 A1 Jan. 18, 2024

(30) Foreign Application Priority Data
Nov. 16, 2020 (CN) ......................... 202011281397.8

(51) Int. Cl.
*H10W 46/00* (2026.01)
*H10W 90/00* (2026.01)
(Continued)

(52) U.S. Cl.
CPC ........... *H10W 46/00* (2026.01); *H10W 90/00* (2026.01); *H10W 46/301* (2026.01);
(Continued)

(58) Field of Classification Search
CPC ....... H01L 23/544; H01L 24/08; H01L 24/19; H01L 24/80; H10W 46/00; H10W 90/00
See application file for complete search history.

(56) References Cited

U.S. PATENT DOCUMENTS

2018/0331070 A1* 11/2018 Seidemann ........... H10W 70/09
2019/0362965 A1 11/2019 Wong et al.
(Continued)

FOREIGN PATENT DOCUMENTS

CN 104733437 A 6/2015
CN 109148415 A 1/2019
(Continued)

*Primary Examiner* — Dale E Page
*Assistant Examiner* — Wilner Jean Baptiste
(74) *Attorney, Agent, or Firm* — MUNCY, GEISSLER, OLDS & LOWE, P.C.

(57) ABSTRACT

A method of bonding first die(s) to a wafer and a die-stack structure includes: providing a first layer of first die(s), each of the first die(s) including a first metal layer; providing the wafer, which includes a second metal layer; bonding the first die(s) to the wafer; forming an insulating layer and a hole, the insulating layer covering the wafer around the first die(s) or filling gap(s) between the first die(s), the hole formed in the insulating layer around the first die(s); forming an interconnect structure in the hole, the first metal layer, the second metal layer and the interconnect structure are electrically connected, thus establishing electrical connection between the first die(s) and the wafer. In this method, it is unnecessary to form TSV within the first die(s), reducing difficulties in the design of internal wiring within the first die(s) and resulting in area savings of the first die(s).

21 Claims, 7 Drawing Sheets

(51) Int. Cl.

| | |
|---|---|
| *H10W 70/00* | (2026.01) |
| *H10W 70/05* | (2026.01) |
| *H10W 70/09* | (2026.01) |
| *H10W 70/60* | (2026.01) |
| *H10W 72/00* | (2026.01) |
| *H10W 72/90* | (2026.01) |
| *H10W 80/00* | (2026.01) |
| *H10W 90/22* | (2026.01) |

(52) U.S. Cl.

CPC .......... *H10W 70/09* (2026.01); *H10W 70/093* (2026.01); *H10W 70/099* (2026.01); *H10W 70/60* (2026.01); *H10W 72/0198* (2026.01); *H10W 72/073* (2026.01); *H10W 72/07323* (2026.01); *H10W 72/941* (2026.01); *H10W 80/327* (2026.01); *H10W 90/22* (2026.01); *H10W 90/732* (2026.01); *H10W 90/792* (2026.01); *H10W 90/794* (2026.01)

(56) References Cited

U.S. PATENT DOCUMENTS

| | | | | |
|---|---|---|---|---|
| 2020/0075549 | A1 | 3/2020 | Zhao et al. | |
| 2020/0235073 | A1* | 7/2020 | Chen ..................... | H10W 90/00 |

FOREIGN PATENT DOCUMENTS

| | | | |
|---|---|---|---|
| CN | 110875202 | A | 3/2020 |
| CN | 111348613 | A | 6/2020 |
| CN | 112397377 | A | 2/2021 |
| JP | 2014-99436 | A | 5/2014 |

* cited by examiner

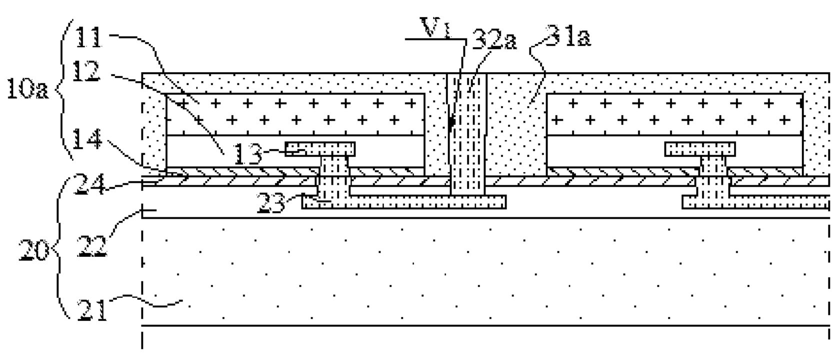
Fig. 3a
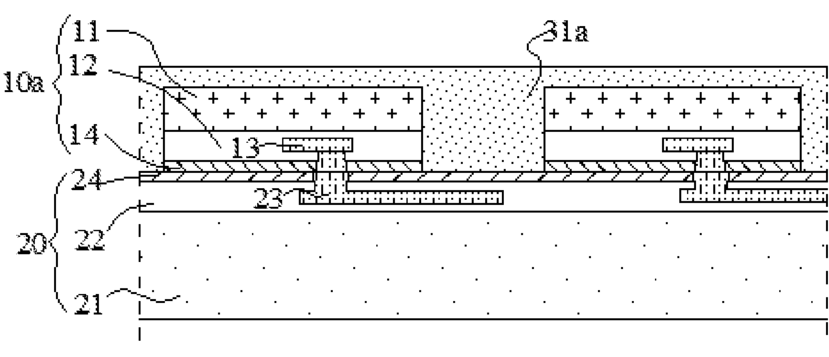
Fig. 3b
Fig. 3c

FIRST CHIP AND WAFER BONDING METHOD AND CHIP STACKING STRUCTURE

TECHNICAL FIELD

The present invention pertains to the field of integrated circuit (IC) fabrication technology, and particularly relates to a method of bonding first die(s) to a wafer and a die-stack structure.

BACKGROUND

As the microelectronics industry steps into the post-Moore's law era, chip structures are evolving toward three-dimensional (3D) stacking in order to achieve higher integration, greater compactness and more excellent performance. Compared with wafer-to-wafer (W2W) stacking, chip-to-wafer (C2W) heterogeneous integration is advantageous in enabling interconnection between chips of different technology nodes and different sizes and providing high flexibility. Moreover, C2W integration allows known good dies (KGDs) to be chosen to be bonded to a wafer. This can result in a significantly increased yield in applications where dies are to be stacked in multiple layers. C2W integration has become an important area of development for 3D-IC technology.

Among the existing C2W stacks, some rely on through-silicon vias (TSV) formed in upper and lower dies after they are bonded together for die-to-die electrical connection. However, such TSVs take up a significant die area, which is unfavorable to chip size reduction.

There are also some in which TSVs are formed in advance in dies to be bonded, followed by bonding of the dies. This process is rather complicated, and substrates of the dies to be bonded have to be thick enough in order to ensure sufficient mechanical strength. Moreover, once bonded, the substrates cannot be thinned anymore due to the presence of the TSVs. On the other hand, if the substrates are thinned and TSVs are formed after the dies are bonded, variation in the overall thickness would be difficult to control due to individual bonding of the dies. As a consequence, it would be difficult to ensure the connectivity and electrical uniformity of the TSVs.

SUMMARY OF THE INVENTION

It is an objective of the present invention to provide a method of bonding first die(s) to a wafer and a die-stack structure, which dispense with the formation of TSV(s) in the first die(s), reduce difficulties in the design of internal wiring within the first die(s), result in area savings of the first die(s), circumvent issues associated with electrical connection between substrate(s) and TSV(s) (e.g., insulation, parasitic capacitance, etc.) and allows lower process complexity.

The present invention provides a method of bonding first die(s) to a wafer, which includes:

- providing a first layer of first die(s), the first layer of first die(s) including N first die(s) each including a first substrate, a first dielectric layer on the first substrate and a first metal layer embedded in the first dielectric layer, where N is an integer≥1;
- providing the wafer, which includes a second metal layer;
- bonding the N first die(s) to the wafer, wherein when N≥2, the N first dies are spaced apart on the wafer;
- forming an insulating layer and a hole, wherein when N=1, the insulating layer covers a top surface of the single first die and the wafer around the single first die; when N≥2, the insulating layer covers top surfaces of the N first dies and fill gap(s) between the N first dies on the wafer; N=1 or N≥2, and a top surface of the insulating layer on the wafer is higher than the top surface(s) of the first die(s); and the hole includes a first hole, which extends through the insulating layer and a partial thickness of the wafer and exposes the second metal layer; and
- forming an interconnect structure, which is filled in the hole, the first metal layer, the second metal layer and the interconnect structure are electrically connected.

Additionally, the formation of the insulating layer and the hole may include:

- forming the insulating layer; and
- etching the insulating layer and a partial thickness of the wafer until the second metal layer is exposed, thereby forming the first hole, wherein the hole includes only the first hole.

Additionally, the hole may further include a second hole, which extends parallel to the wafer, connects with the respective first hole and is located at least partially above the respective first die.

Additionally, the formation of the insulating layer and the hole may include:

- forming the insulating layer;
- forming the second hole by etching a portion of the insulating layer higher than the top surface(s) of the first die(s); and
- forming the first hole by etching the insulating layer above the wafer exposed in the second hole and a partial thickness of the wafer, the first hole exposing the second metal layer.

Additionally, the insulating layer may include a first insulating layer and a second insulating layer, wherein the formation of the insulating layer and the hole includes:

- forming the first insulating layer, which is arranged on the wafer; performing a chemical mechanical polishing (CMP) process on a top surface of the first insulating layer until the top surface of the first insulating layer is flush with the top surface(s) of the first die(s);
- forming the first hole, which extends through the first insulating layer and a partial thickness of the wafer and exposes the second metal layer;
- forming a filling layer in the first hole;
- forming the second insulating layer, which covers the first die(s), the filling layer and the first insulating layer; and
- forming the second hole by etching the second insulating layer.

Additionally, a side of the first die(s) which is proximate to the first metal layer may be bonded to the wafer, the first metal layer is/are electrically connected to the second metal layer.

Additionally, the interconnect structure may be electrically connected to the second metal layer.

Additionally, after the formation of the interconnect structure, the method may further include the formation of a lead-out layer, which includes:

- forming a separation layer, which covers the interconnect structure and the insulating layer;
- forming a lead-out hole, which extends through the separation layer and exposes the interconnect structure; and
- filling the lead-out layer in the lead-out hole, the lead-out layer is electrically connected to the interconnect structure.

Additionally, the method may further include:

providing an M-th layer of first die(s), where M is an integer ≥2, and repeating the steps for forming the insulating layer, the hole(s), the interconnect structure, the separation layer and the lead-out layer of the first layer of first die(s) to form an insulating layer, a hole, an interconnect structure, a separation layer and a lead-out layer of the M-th layer of first die(s), the insulating layer of the M-th layer of first die(s) covering a separation layer of an (M−1)-th layer of first die(s);

bonding the separation layer of the M-th layer of first die(s) to the separation layer of the (M−1)-th layer of first die(s), wherein a metal layer of the M-th layer of first die(s) is electrically connected to a lead-out layer of the (M−1)-th layer of first die(s).

Additionally, a side of the first die(s) which is proximate to the first metal layer may be bonded to the wafer.

Additionally, the hole may further include a third hole connecting with the respective second hole, the third hole extending through a partial thickness of the first dielectric layer and exposing the respective first metal layer, wherein the interconnect structure is filled in the first, second and third holes.

Additionally, first alignment marks may be formed in the first dielectric layer of the first die(s) and respective second alignment marks in the wafer, the first alignment marks aligned with the respective second alignment marks in a thickness direction of the first dies, wherein third alignment marks are formed in the insulating layer by exposure and development as replicas of the second alignment marks, the projections of the third alignment marks on the wafer coinciding with projections of the second alignment marks on the wafer.

Additionally, after the formation of the interconnect structure, the method may further include forming an isolation layer, which covers the interconnect structure and the insulating layer.

Additionally, the method may further include:

providing an L-th layer of first die(s), where L is an integer ≥2, and repeating the steps for forming the insulating layer, the hole, the interconnect structure and the isolation layer of the first layer of first die(s) to form an insulating layer, a hole, an interconnect structure and an isolation layer of the L-th layer of first die(s), the insulating layer of the L-th layer of first die(s) covering an isolation layer of an (L−1)-th layer of first die(s); and bonding the isolation layer of the L-th layer of first die(s) to the isolation layer of the (L−1)-th layer of first die(s), wherein metal layer of the L-th layer of first die(s) is brought into contact with and electrically connected to interconnect structure of the (L−1)-th layer of first die(s).

The present invention further provides a die-stack structure including:

a first die including a first substrate, a first dielectric layer on the first substrate and a first metal layer embedded in the first dielectric layer;

a second die including a metal layer, the second die having an area larger than an area of the first die, the second die bonded to the first die;

an insulating layer and a hole, the insulating layer covering a top surface of the first die and the second die around the first die, the insulating layer having a top surface above the second die that is higher than a top surface of the first die, the hole including a first hole, which extends through the insulating layer and a partial thickness of the second die and exposes the second metal layer; and an interconnect structure filled in the hole, the first metal layer, the second metal layer and the interconnect structure are electrically connected.

Additionally, the hole may further include a second hole, which extends parallel to the first die, connects with the first hole and is at least partially located above the first die.

Additionally, a side of the first die which is proximate to the first metal layer may be bonded to the second die, the first metal layer is electrically connected to the second metal layer.

Additionally, the die-stack structure may further include:

a separation layer covering the interconnect structure and the insulating layer;

a lead-out hole extending through the separation layer and exposing the interconnect structure; and a lead-out layer filled in the lead-out hole and electrically connected to the interconnect structure.

Additionally, a side of the first die away from the first metal layer may be bonded to the second die.

Additionally, the hole may further include a third hole connecting with the second hole, the third hole extending through a partial thickness of the first dielectric layer and exposing the first metal layer, wherein the interconnect structure is filled in the first, second and third holes.

Compared with the prior art, the present invention has the following benefits:

The present invention provides a method of bonding first die(s) to a wafer and a die-stack structure. The method includes: providing a first layer of first die(s), which include(s) N first die(s) each including a first metal layer; providing the wafer, which includes a second metal layer; bonding the first die(s) to the wafer; forming an insulating layer and a hole, the insulating layer covering the wafer around the first die(s) or filling gap(s) between the first die(s), the hole formed in the insulating layer around the first die(s); forming interconnect structure in the hole, the first metal layer, the second metal layer and the interconnect structure is electrically connected, thus establishing electrical connection between the first die(s) and the wafer. In this method, it is unnecessary to form TSV within the first die(s), reducing difficulties in the design of internal wiring within the first die(s) and resulting in area savings of the first die(s). The absence of TSV circumvents issues associated with electrical connection between substrate and TSV (e.g., insulation, parasitic capacitance, etc.). Further, process complexity can be reduced because it is not necessary to take into account the influence of thickness variation of the first die(s) on the formation of through hole by etching.

BRIEF DESCRIPTION OF THE DRAWINGS

FIGS. 2, 3*a*, 3*b*, 3*c*, 3*d*, 3*e*, and 4 to 7 are schematic illustrations of various steps in a method of bonding first die(s) to a wafer according to an embodiment of the present invention.

In these figures:

10*a*, 10*b* to 10*n*—first die; 20'—second die; 11—first substrate; 12—first dielectric layer; 13—first metal layer; 14—first bonding layer;

20—wafer; 21—second substrate; 22—second dielectric layer; 23—second metal layer; 24—second bonding layer;

31*a*—insulating layer; 32*a*—interconnect structure; 34*a*—separation layer; 35—lead-out layer; 36—pad;

40*a*, 40*b* to 40*n*—first die; 50'—second die; 41—first substrate; 42—first dielectric layer; 43—first metal layer; 44—first alignment mark;

50—wafer; 51—second substrate; 52—second dielectric layer; 53—second metal layer; 54—second alignment mark; 55—second bonding layer;

61*a*, 61*b*, 61*n*—insulating layer; 62*a*, 62*b*—interconnect structure; 63*a*, 63*b*, 63*n*—third alignment mark; 64*a*—isolation layer; 65—pad.

DETAILED DESCRIPTION

On the above basis, embodiments of the present invention provide methods of bonding first die(s) to a wafer and die-stack structures. The present invention will be described in greater detail below with reference to the accompanying drawings and to specific embodiments. Advantages and features of the present invention will become more apparent from the following description. Note that the figures are provided in a very simplified form not necessarily drawn to exact scale and for the only purpose of facilitating easy and clear description of the embodiments.

As mentioned herein, any dielectric, insulating or other layer, such as the first dielectric layer, the first insulating layer or the like, may be either a single-layer structure made of a single material, or a multi-layer structure formed of either a single or multiple materials.

Figure 1:
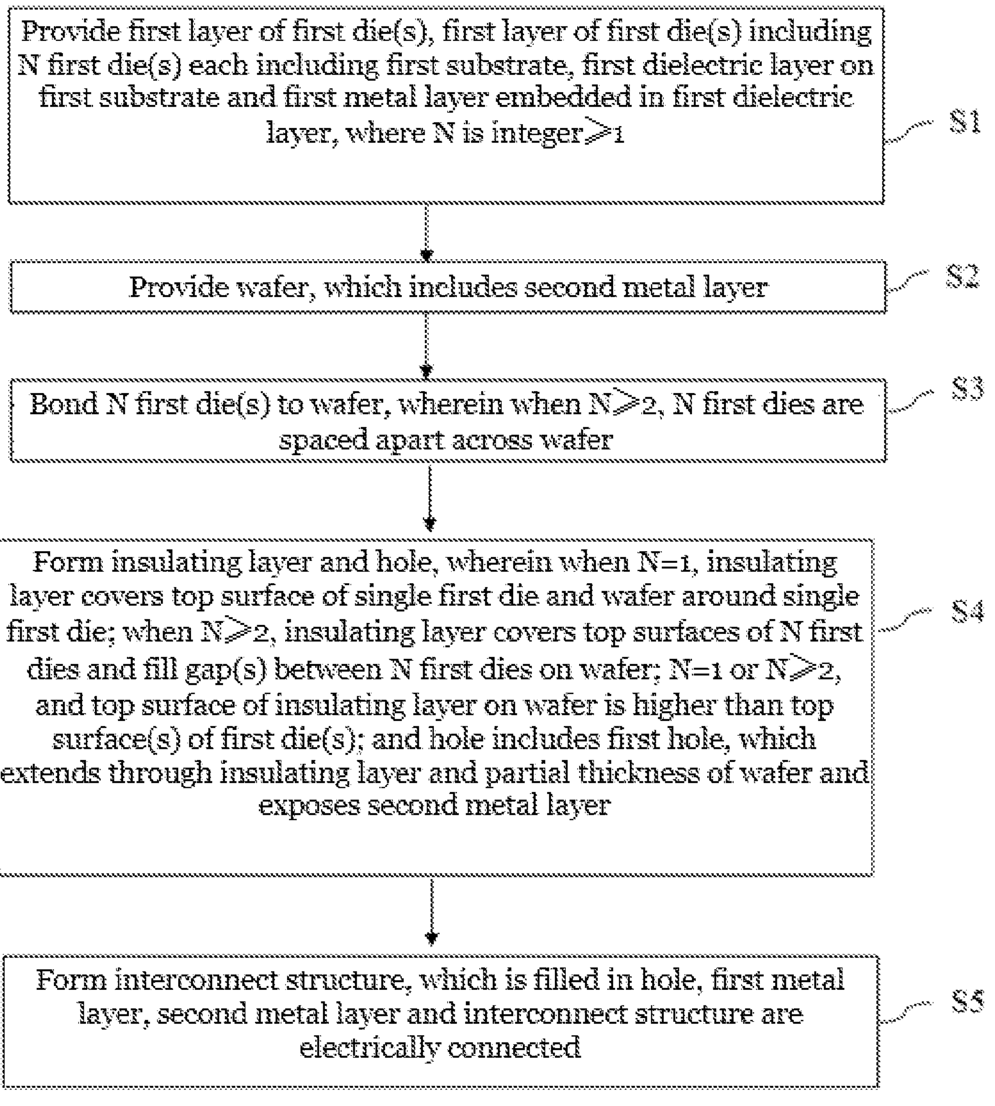
FIG. 1 depicts a flowchart of a method of bonding first die(s) to a wafer according to an embodiment of the present invention.

In an embodiment of the present invention, there is provided a method of bonding first die(s) to a wafer. As shown in FIG. 1, the method includes:

providing a first layer of first die(s), which include(s) N first die(s) each including a first substrate, a first dielectric layer on the first substrate and a first metal layer embedded in the first dielectric layer, where N is an integer≥1;

providing the wafer, which includes a second metal layer;

bonding the N first die(s) to the wafer, wherein when N≥2, the N first dies are spaced apart on the wafer;

forming an insulating layer and hole(s), wherein when N=1, the insulating layer covers a top surface of the single first die and the wafer around the single first die; when N≥2, the insulating layer covers top surfaces of the N first dies and fill gap(s) between the N first dies on the wafer; N=1 or N≥2, and a top surface of the insulating layer on the wafer is higher than the top surface(s) of the first die(s); and each of the hole(s) includes a first hole, which extends through the insulating layer and a partial thickness of the wafer and exposes the second metal layer; and forming interconnect structure(s), which is/are filled in the hole(s), the first metal layer(s), the second metal layer and the interconnect structure(s) are electrically connected.

Various steps in a first method of bonding first die(s) to a wafer according to an embodiment of the present invention will be described below with reference to FIGS. 2 to 7. In this method, a side of the first die(s) which is proximate to the first metal layer is bonded to the wafer.

Figure 2:
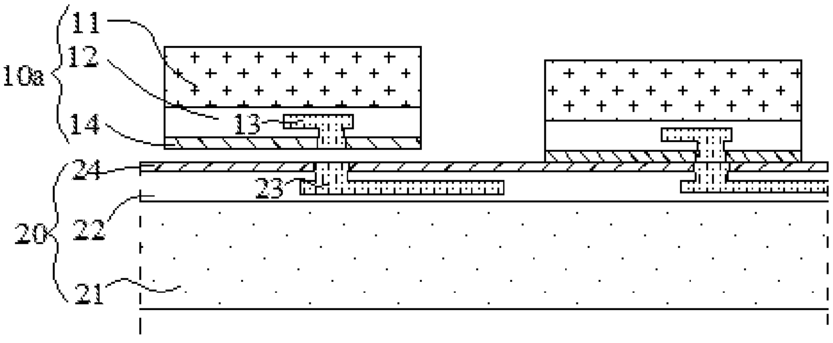

As shown in FIG. 2, a first layer of first die(s) is/are provided. The first die(s) include(s) N first die(s) 10*a*, each first die 10*a* includes a first substrate 11, a first dielectric layer 12 on the first substrate 11 and a first metal layer 13 embedded in the first dielectric layer 12. N is an integer ≥1.

The wafer 20 is provided, the wafer 20 includes a second substrate 21, a second dielectric layer 22 on the second substrate 21 and a second metal layer 23 embedded in the second dielectric layer 22.

Each first die 10*a* may further include a first bonding layer 14, and the wafer 20 may further include a second bonding layer 24. The first bonding layer(s) 14 and the second bonding layer 24 are intended to be bonded face-to-face to each other.

The N first die(s) 10*a* is/are bonded to the wafer 20. When N≥2, the N first dies are spaced apart on the wafer. The first die(s) 10*a* may be bonded to the wafer 20 by hybrid bonding (involving both metal-to-metal bonding and dielectric-to-dielectric bonding). Specifically, when N≥2, the N first dies 10*a* may be bonded to the wafer 20 one by one. Alternatively, the N first dies 10*a* may be all temporarily attached to a carrier wafer at predetermined locations and then simultaneously bonded to the wafer 20 with the aid of the carrier wafer. After that, the carrier wafer may be separated from the N first dies 10*a*.

A side of the first die(s) 10*a* which is proximate to the first metal layer 13 is bonded to the wafer 20, the first metal layer(s) 13 is/are electrically connected to the second metal layer 23. It is possible to bond either a single or several (≥2) first dies to the wafer. The several first dies may be either of the same structure or of different structures.

As shown in FIG. 3*a*, an insulating layer 31*a* is formed. The insulating layer 31*a* may be a silicon oxide layer, for example. When N=1, the insulating layer 31*a* covers a top surface of the single first die 10*a* and the wafer 20 around the single first die 10*a*. When N≥2, the insulating layer 31*a* covers top surfaces of the N first dies and fill gap(s) between the N first dies on the wafer 20. N=1 or N≥2, and a top surface of the insulating layer 31*a* on the wafer 20 is higher than the top surface(s) of the first die(s) 10*a*.

Hole(s) is/are formed each extending through the insulating layer 31*a* and a partial thickness of the wafer 20 and exposing the second metal layer 23. In this embodiment, each hole includes only a first hole $V_1$. That is, each hole consists of a first hole $V_1$. Interconnect(s) 32*a* is/are formed, which are filled in the hole(s), the first metal layer(s) 13, the second metal layer 23 and the interconnect structure(s) 32*a* are electrically connected. The interconnect structure(s) 32*a* in the first hole(s) $V_1$ electrically connect(s) the first die(s) 10*a* to the wafer 20 and lead(s) out electrical signals.

Optionally, each hole may further include a second hole extending parallel to the wafer, and the second hole connects with the respective first hole. The second hole(s) is/are at least partially located above the first die(s).

A first method for forming the insulating layer and the hole(s) will be described below with reference to FIGS. 3*b*, 3*c* and 4. As shown in FIG. 3*b*, the insulating layer 31*a* is formed. As shown in FIG. 3*c*, the second hole(s) $V_2$ is/are formed by partially etching away the insulating layer 31*a* above the top surface(s) of the first die(s) 10*a*. As shown in FIG. 4, the first hole(s) $V_1$ is/are formed by etching through the insulating layer 31*a* above the wafer 20 exposed in the second hole(s) $V_2$ and a partial thickness of the wafer 20, the first hole(s) $V_1$ exposing the second metal layer 23. The second hole(s) $V_2$ extend(s) parallel to the wafer 20. The second hole(s) $V_2$ connect(s) with the first hole(s) $V_1$. Although the formation of the second hole(s) $V_2$ is shown in FIGS. 3c and 4 as preceding the formation of the first hole(s) $V_1$, it would be appreciated that it is also possible that the formation of the first hole(s) $V_1$ precedes the formation of the second hole(s) $V_2$.

A second method for forming the insulating layer and the hole(s) will be described below with reference to FIGS. 3d, 3e and 4. In this case, the insulating layer 31a includes a first insulating layer 311 and a second insulating layer 312.

Figure 3D:
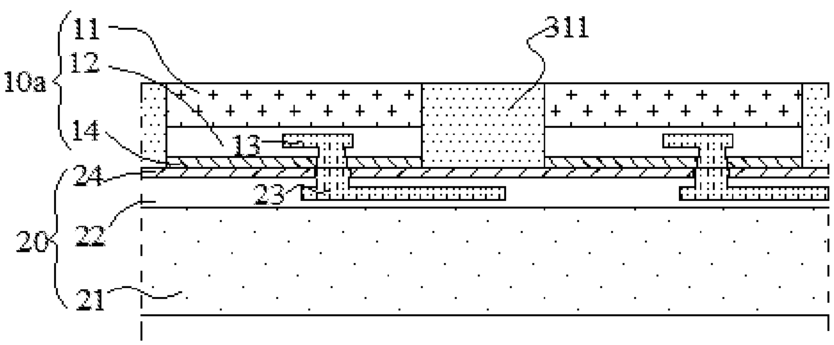
Figure 3E:
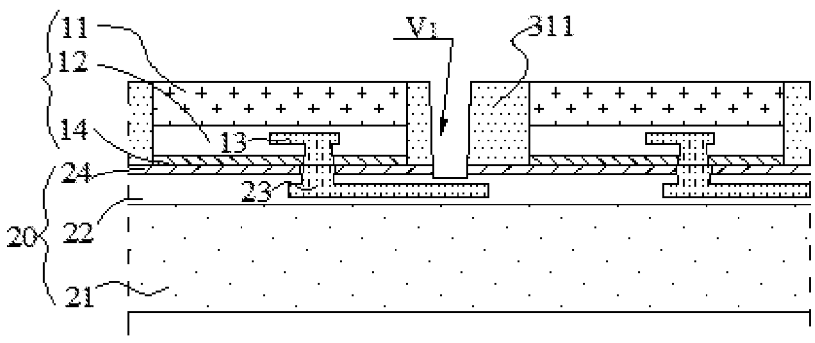
Figure 4:
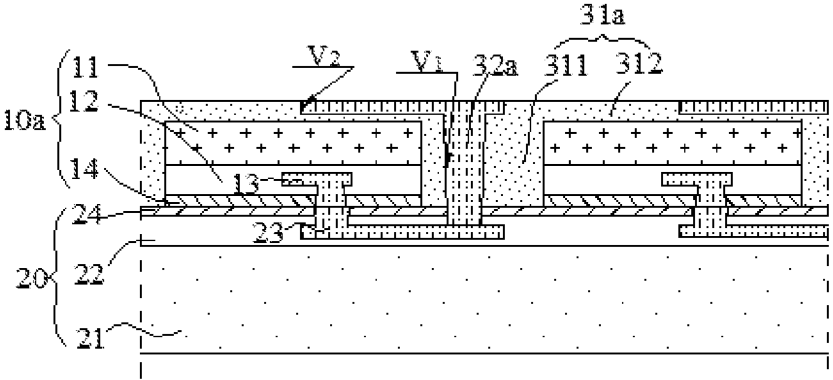

As shown in FIG. 3d, the first insulating layer 311 is formed, which resides on the wafer 20 and is contiguous with the first die(s) 10a. In case of multiple first dies 10a, the first insulating layer 311 fills gap(s) between adjacent first dies 10a. A chemical mechanical polishing (CMP) process is performed to thin and planarize the first die(s) 10a and the first insulating layer 311. As a result of thinning the first die(s) 10a by CMP, a top surface of the first insulating layer 311 is flush with top surface(s) of the first substrate(s) 11. As shown in FIG. 3e, the first hole(s) $V_1$ is/are formed, which extend(s) through the first insulating layer 311 and a partial thickness of the wafer 20, without exposure of the second metal layer 23 (i.e., it/they terminate(s) above the second metal layer 23). A filling layer such as a bottom anti-reflection coating (BARC) is formed in the first hole(s) $V_1$. The material of the filling material deposited outside of the first hole(s) $V_1$ is then removed, with the remainder being present only in the first hole(s) $V_1$. The second insulating layer 312 is then formed, which covers the first die(s) 10a, the filling layer and the first insulating layer 311.

The second hole(s) $V_2$ is/are formed by etching the second insulating layer 312. The second hole(s) $V_2$ extend(s) parallel to the wafer 20 and the second hole(s) $V_2$ connect(s) with the first hole(s) $V_1$. The second hole(s) $V_2$ is/are at least partially located above the first die(s) 10a. Subsequently, the filling layer in the first hole(s) $V_1$ is etched away, and depending on a depth of the second hole(s) $V_2$, the second insulating layer 312 may be also partially etched away. As a result, the second metal layer 23 is exposed. After that, as shown in FIG. 4, the interconnect structure(s) 32a are formed in both the second hole(s) $V_2$ and the first hole(s) $V_1$, the interconnect structure(s) 32a may be electrically connected to the second metal layer 23, the first metal layer(s) 13 may be electrically connected to the second metal layer 23. In this way, electrical connection is achieved between the first metal layer(s) 13, the second metal layer 23 and the interconnect structure(s) 32a. As shown in FIG. 4, section(s) of the interconnect structure(s) received in the laterally-extending (parallel to the wafer 20) second hole(s) $V_2$ provide(s) greater flexibility in metal layer distribution of the subsequently-stacked die(s) because electrical connection can be easily established between the die(s) and the section(s) of the interconnect structure(s).

Figure 5:
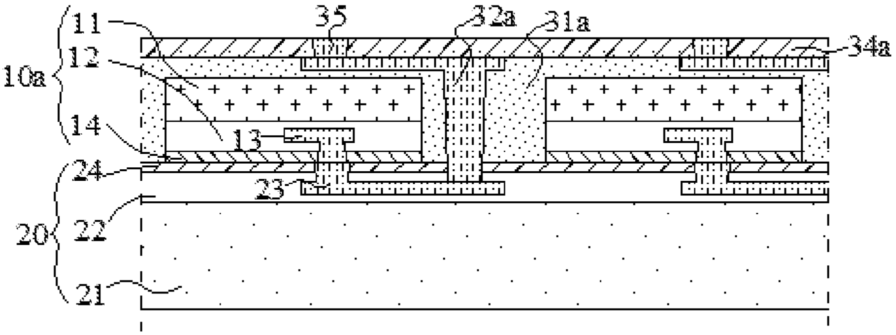

As shown in FIG. 5, after the formation of the interconnect structure(s), the method may further include the formation of a lead-out layer 35, which may specifically include:

forming a separation layer 34a, the separation layer 34a covers the interconnect structure(s) 32a and the insulating layer 31a; forming lead-out hole(s), which extend(s) through the separation layer 34a and expose(s) the interconnect structure(s) 32a; and filling the lead-out layer 35 in the lead-out hole(s). The lead-out layer 35 is electrically connected to the interconnect structure(s) 32a.

Figure 6:
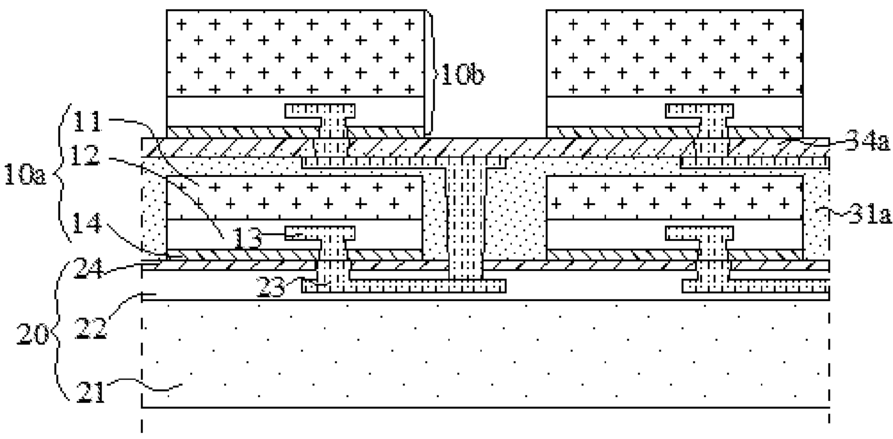

Only one layer of die(s), for example, the first layer of first die(s), may be stacked on the wafer 20, and the interconnect structures 32a may operably lead out electrical signals from the first die(s) 10a and the wafer 20. Alternatively, several layers of die(s), for example, M (M≥2) layers of first die(s), may be stacked on the wafer 20, as practically needed. The latter case is shown in FIGS. 6 and 7.

In this case, an M-th layer of first die(s) (e.g., 10b, 10n) may be provided, where M is an integer ≥2. The same method as used for the first layer of first die(s) 10a may be employed to form an insulating layer (e.g., 31b, 31n), hole(s), interconnect structure(s), a separation layer (e.g., 34b) and a lead-out layer for the M-th layer of first die(s). The insulating layer (e.g., 31b) for the M-th layer of first die(s) may cover a separation layer (e.g., 34a) for an (M−1)-th layer of first die(s).

The M-th layer of first die(s) (e.g., 10b) may be bonded to the separation layer (e.g., 34a) of the (M−1)-th layer of first die(s), metal layer(s) in the M-th layer of first die(s) is/are electrically connected to a lead-out layer for the (M−1)-th layer of first die(s). In this way, multiple layers of first die(s) (e.g., 10a and 10b through 10n) can be stacked on the wafer 20. Without limitation, the first dies in different layers may be either of the same structure, or of different structures, depending on the requirements of practical applications. Lead-out pad(s) 36 may be formed on the topmost layer of first die(s). The pad(s) 36 may be formed of, for example, aluminum. The pad(s) 36 may be electrically connected to interconnect structure(s) or a lead-out layer for the topmost layer.

Figure 7:
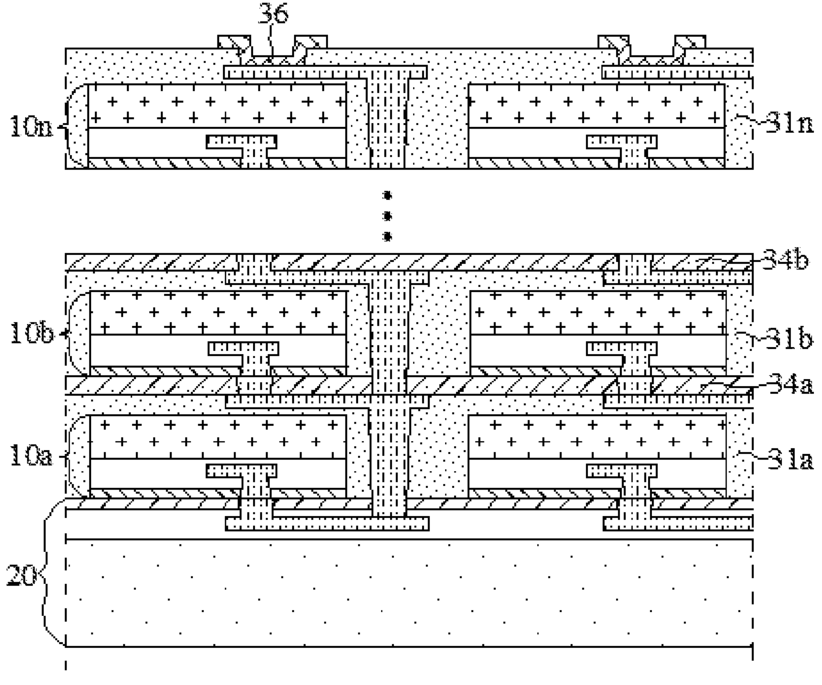

FIG. 7 shows an example in which the pad(s) 36 is/are electrically connected to section(s) of the interconnect structure(s) in second hole(s) (extending parallel to the first die(s)). Optionally, the second hole(s) (extending parallel to the first die(s)) may be omitted from the topmost layer of first die(s) (e.g., 10n). Instead, only first hole(s) (extending perpendicular to the first dies) may be formed, and the pad(s) 36 may be electrically connected to the interconnect structure(s) in the first hole(s), depending on the requirements of practical applications. It would be appreciated that, for each layer, there may be one or more isolation layers and one or more insulating layers.

In the first method, the first die(s) is/are allowed to be additionally thinned to meet the requirements for higher integration and a smaller size. The insulating layer resides on the wafer and is contiguous with the first die(s). In other words, the insulating layer surrounds the first die(s). Moreover, the interconnect structure(s) formed in the holes in the insulating layer electrically connect(s) the first metal layer(s) to the second metal layer, thereby establishing electrical connection between the first die(s) and the wafer, without needing to form TSV(s) in the first die(s). This reduces difficulties in the design of internal wiring within the first die(s) and results in area savings of the first die(s). Gap(s) between adjacent first die(s) can be fully utilized during the bonding of the first die(s) and the wafer. The interconnect structure(s) can be formed in such gap(s) between adjacent first die(s), in particular when an area of the first die(s) differs from an area of corresponding die(s) on the wafer, for example, when the area of the first die(s) is smaller than the area of the die(s) on the wafer. The absence of TSV(s) circumvents issues associated with electrical connection between the substrate(s) and TSVs (e.g., insulation, parasitic capacitance, etc.). Further, process complexity can be reduced because it is not necessary to take into account the influence of thickness variation of the first die(s) on the formation of through hole(s) by etching.

Here, the area of the die(s) on the wafer should be broadly interpreted as referring either to an actual wafer area physically taken up by the die(s), i.e., by various circuits, devices, connections and the like thereof, or to an enlarged wafer area further accommodating the interconnect structure(s) constructed in accordance with the present invention (i.e., it is greater than the actual area). The additional wafer area may be provided either by dicing lane(s) or the gap(s) between the dies. The area of the first die(s) refers to an area of each single first die after a dicing process.

Various steps in a second method of bonding first die(s) to a wafer according to an embodiment of the present invention will be described below with reference to FIGS. 8 to 13. In this method, a side of the first die(s) away from its/their first metal layer(s) is bonded to the wafer.

Figure 8:
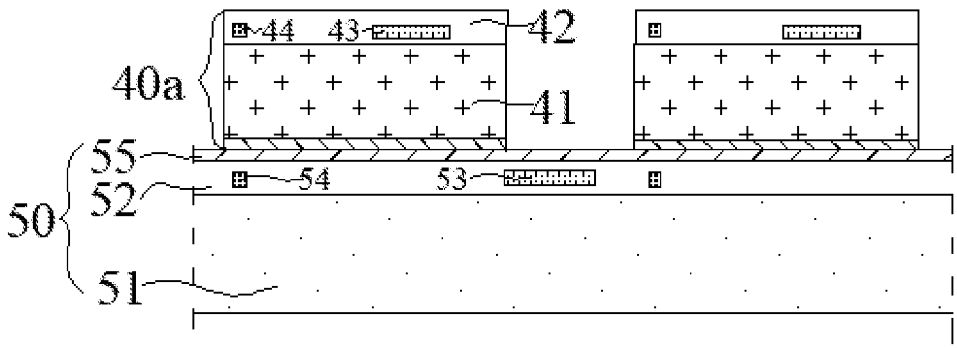
FIGS. 8 to 13 are schematic illustrations of various steps in a second method of bonding first die(s) to a wafer according to an embodiment of the present invention.

As shown in FIG. 8, a first layer of the first die(s) 40*a* may be provided. The first die(s) include(s) N first die(s) 40*a*, each including a first substrate 41, a first dielectric layer 42 on the first substrate 41 and a first metal layer 43 embedded in the first dielectric layer 42. N is an integer ≥1.

The wafer 50 is provided, which includes a second substrate 51, a second dielectric layer 52 on the second substrate 51 and a second metal layer 53 embedded in the second dielectric layer 52.

For example, the first die(s) 40*a* may further include first alignment marks 44, the first alignment marks 44 are formed in the first dielectric layer(s) 42, and the wafer 50 may further include second alignment marks 54. When the first alignment marks 44 are aligned with the respective second alignment marks 54 in a thickness direction of the first die(s) 40*a* or the wafer 50, alignment between the first die(s) 40*a* and the wafer 50 is attained. Each of the first die(s) 40*a* may further include a first bonding layer, and the wafer 50 may further include a second bonding layer 55. The first bonding layer(s) and the second bonding layer 55 are intended to be bonded to each other.

The first die(s) 40*a* is/are bonded to the wafer 50. The first die(s) 40*a* may be known good die(s) (KGD(s)), for example. A side of the first die(s) 40*a* away from the first metal layer(s) 43 (i.e., at their back side) is bonded to the wafer 50.

Figure 9:
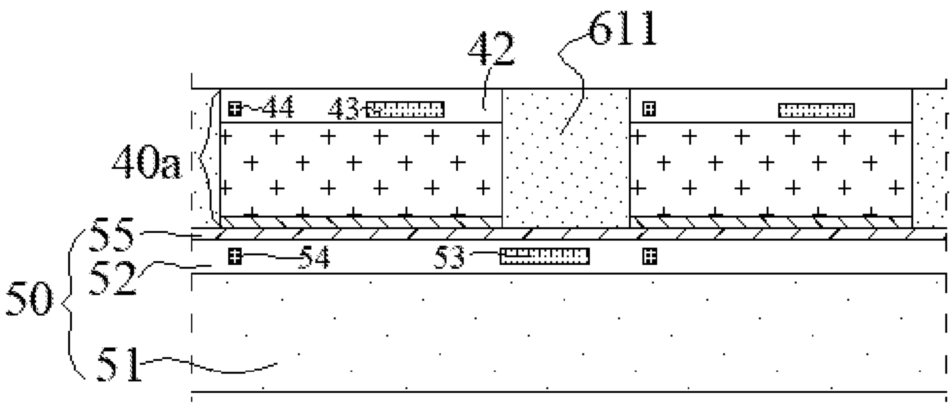

As shown in FIG. 9, a first insulating layer 611 is formed, which resides on the wafer 50 and is contiguous with the first die(s) 40*a*. In case of multiple first dies 40*a*, the first insulating layer 611 fills gap(s) between adjacent first dies 40*a*. A top surface of the first insulating layer 611 is flush with top surface(s) of the first die(s) 40*a*. The first insulating layer 611 may be formed by a deposition process and planarized by a CMP process.

Figure 10:
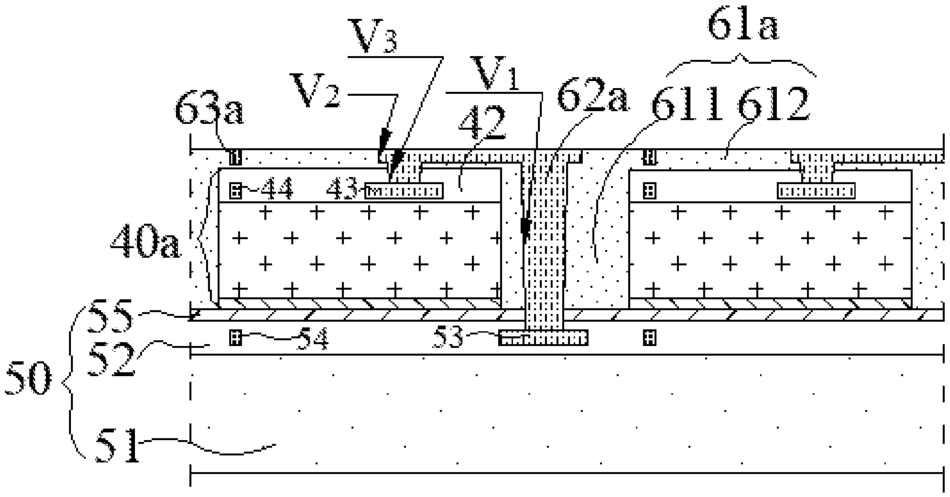

As shown in FIGS. 9 and 10, first hole(s) $V_1$ is/are formed, which extend(s) through the first insulating layer 611 and a partial thickness of the wafer 50 and expose(s) the second metal layer 53. A second insulating layer 612 is formed, which may be also considered as a redistribution layer (RDL). The second insulating layer 612 covers the first die(s) 40*a* and the first insulating layer 611. The second insulating layer 612 is etched, thereby forming second hole(s) $V_2$. The second hole(s) $V_2$ extend(s) parallel to the wafer 50, the second hole(s) $V_2$ connect(s) with the first hole(s) $V_1$. The second hole(s) $V_2$ are at least partially located above the first die(s) 40*a*. Third hole(s) $V_3$ connects with the second hole(s) $V_2$ is/are then formed. The third hole(s) $V_3$ extend(s) through a partial thickness of the first dielectric layer(s) 42 and expose(s) the first metal layer(s) 43. The insulating layer 61*a* includes a first insulating layer 611 and a second insulating layer 612.

The first hole(s) $V_1$, the second hole(s) $V_2$ and the third hole(s) $V_3$ are not limited to being formed in any particular order. For example, the second hole(s) $V_2$ may be formed immediately after the formation of the insulating layer 61*a*, and the first holes $V_1$ and the third holes $V_3$ may be formed subsequently.

Next, interconnect structure(s) 62*a* are formed within the first hole(s) $V_1$, the second hole(s) $V_2$ and the third hole(s) $V_3$, and the interconnect structure(s) 62*a* are electrically connected to both the first metal layer(s) 43 and the second metal layer 53. In order to enable alignment between the interconnect structure(s) 62*a* and the second metal layer 53, corresponding alignment marks may be provided in the second insulating layer 612 and the second dielectric layer 52.

Only one layer of die(s), for example, the first layer of first die(s) 40*a*, may be stacked on the wafer 50, and the interconnect structure(s) 62*a* may operably interconnect the first die(s) 40*a* and the wafer 50 and lead out electrical signals therefrom. Alternatively, several layers of die(s), for example, L (L≥2) layers of first die(s), may be stacked on the wafer 50, as practically needed.

Figure 11:
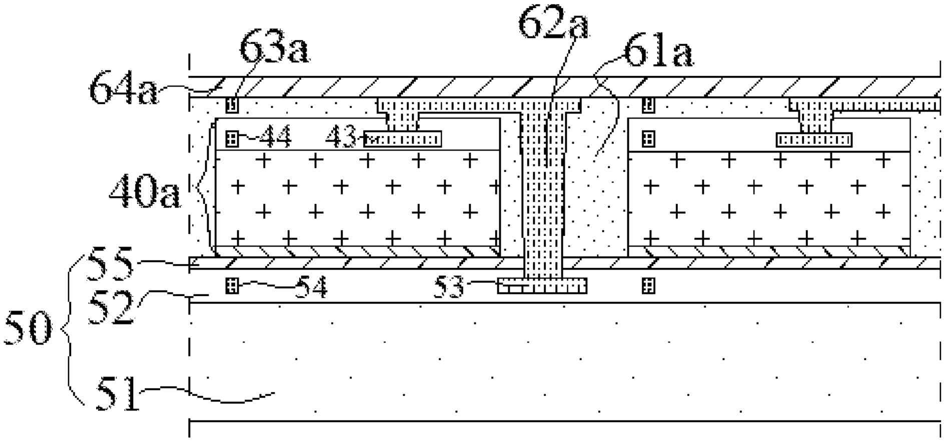

As shown in FIG. 11, an isolation layer 64*a* is formed, which covers the interconnect structures 62*a* and the insulating layer 61*a*.

Figure 12:
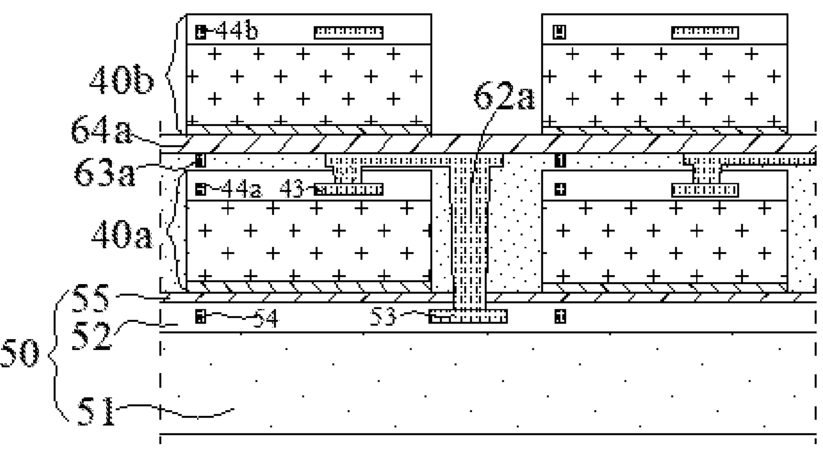
Figure 13:
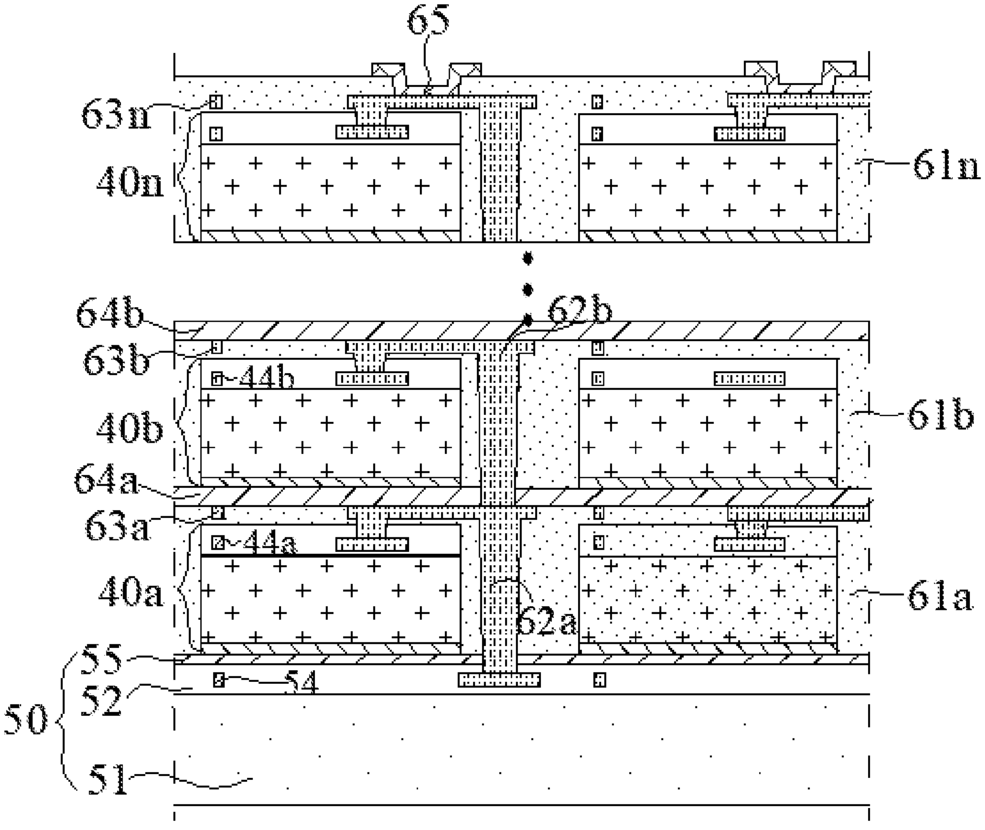

As shown in FIGS. 12 and 13, an L-th layer of first die(s) (e.g., 40*b*, 40*n*) may be provided, where L is an integer ≥2. The same method as used for the first layer of first die(s) 40*a* may be employed to form an insulating layer (e.g., 61*b*, 61*n*), hole(s), interconnect structure(s) (e.g., 62*b*) and an isolation layer (e.g., 64*b*) for the L-th layer of first die(s). The insulating layer (e.g., 61*b*) for the L-th layer of first die(s) may cover an isolation layer (e.g., 64*a*) for an (L−1)-th layer of first die(s).

The L-th layer of first dies (e.g., 40*b*) may be bonded to the isolation layer (e.g., 64*a*) of the (L−1)-th layer of first dies, the interconnect structure(s) (e.g., 62*b*) for the L-th layer of first die(s) is brought into contact with and electrically connected to the interconnect structure(s) (e.g., 62*a*) for the (L−1)-th layer of first die(s).

During alignment for bonding, a lower lens may identify, and capture images of, the first alignment marks 44*a* in the first die(s) 40*a*, and an upper lens may identify, and capture images of, the respective corresponding second alignment marks 54 in the wafer 50. The images may be processed, and the first die(s) 40*a* may be then moved into alignment with the wafer 50 according to the results of the image processing.

Third alignment marks 63*a* may be formed in the insulating layer 61*a*. The third alignment marks 63*a* may be replicas of the second alignment marks 54 formed by exposure and development at locations corresponding to those of the second alignment marks 54 in the wafer 50. This is equivalent to transferring the second alignment marks 54 in the wafer 50 to the upper layer and can facilitate subsequent alignment and identification. For example, as shown in FIG. 12, subsequently, first alignment marks 44*b* in a second layer of first die(s) 40*b* may be aligned with the third alignment marks 63*a* in the insulating layer 61*a* for the first layer. In this way, the alignment for bonding of each subsequently stacked layer of first die(s) is made independent of the location(s) of the previous stacked layer of first die(s), as it is equivalent to alignment with the second alignment marks 54 within the common reference wafer 50.

In this way, multiple layers of first die(s) (e.g., 40*a* and 40*b* through 40*n*) can be stacked on the wafer 50. Without limitation, the first dies in different layers may be either of the same structure, or of different structures, depending on the requirements of practical applications. Lead-out pad(s) 65 may be formed on the topmost layer of first die(s). The pad(s) 65 may be formed of, for example, aluminum. The pad(s) 65 may be electrically connected to interconnect structure(s) or a lead-out layer for the topmost layer.

The present invention also provides a die-stack structure, including:

a first die including a first substrate, a first dielectric layer on the first substrate and a first metal layer embedded in the first dielectric layer;

a second die including a metal layer, the second die having an area larger than an area of the first die, the second die bonded to the first die;

an insulating layer and a hole, the insulating layer covering a top surface of the first die and the second die around the first die, the insulating layer having a top surface above the second die that is higher than a top surface of the first die, the hole including a first hole, which extends through the insulating layer and a partial thickness of the second die and exposes the second metal layer; and an interconnect structure filled in the hole, the first metal layer, the second metal layer and the interconnect structure are electrically connected.

It would be appreciated that the die-stack structure can be obtained by dicing a structure constructed in accordance with the above-discussed method of bonding first die(s) to a wafer, and the second die is obtained as a result of dicing the wafer. The area of the second die is just an area of each single die obtained by dicing the wafer.

Figure 14:
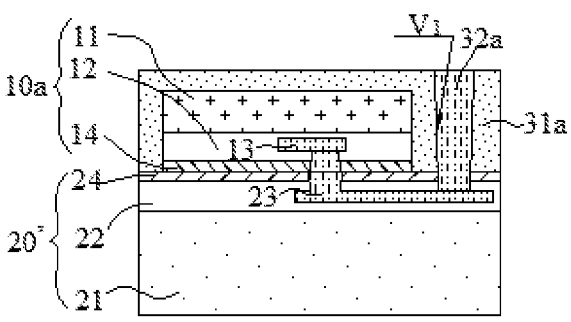
FIGS. 14 to 16 are schematic illustrations of three die-stack structures according to embodiments of the present invention.
Figure 15:
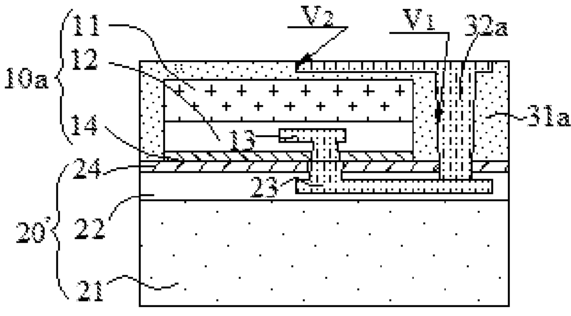
Figure 16:
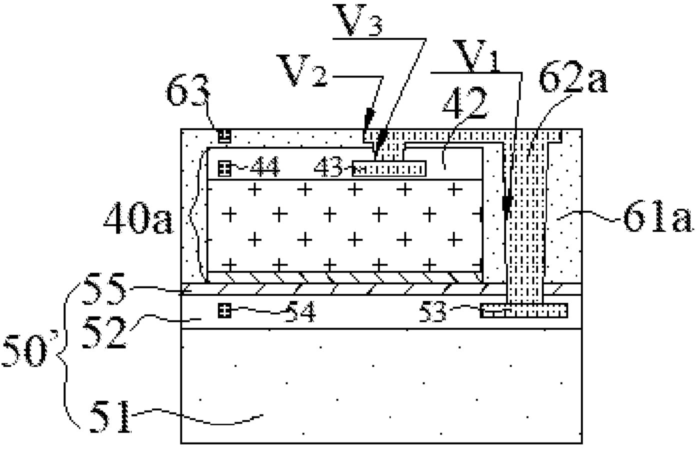

FIGS. 14 to 16 show three examples of the die-stack structure. Since a detailed description thereof has been set forth above in connection with the method of bonding first die(s) to a wafer, only a brief description is given below.

As shown in FIG. 14, the die-stack structure includes the first die 10*a* and the second die 20'. The second die 20' is obtained by dicing the aforementioned wafer 20. In this example, the hole only includes the first hole $V_1$, and the interconnect structure 32*a* is filled in the hole, the first metal layer 13, the second metal layer 23 and the interconnect structure 32*a* are electrically connected. The interconnect structure 32*a* in the first hole $V_1$ electrically connect the first die 10*a* to the second die 20' and lead out electrical signals.

As shown in FIG. 15, the die-stack structure includes the first die 10*a* and the second die 20'. A side of the first die 10*a* which is proximate to the first metal layer 13 is bonded to the second die 20'. The hole includes the first hole $V_1$ and a second hole $V_2$. The second hole $V_2$ extends parallel to the second die 20', the second hole $V_2$ connects with the first hole $V_1$. The second hole $V_2$ is at least partially located above the first die 10*a*. A side of the first die 10*a* which is proximate to the first metal layer 13 is bonded to the second die 20', the first metal layer 13 is electrically connected to the second metal layer 23. The interconnect structure 32*a* is filled in both the first hole $V_1$ and the second hole $V_2$, the interconnect structure 32*a* is electrically connected to the second metal layer 13.

As shown in FIG. 16, the die-stack structure includes the first die 40*a* and the second die 50'. A side of the first die 40*a* away from the first metal layer 43 is bonded to the second die 50'. The hole includes the first hole $V_1$, a second hole $V_2$ and a third hole $V_3$. The third hole $V_3$ extends through a partial thickness of the first dielectric layer 42 and exposes the first metal layer 43. The interconnect structure 62*a* is located within the first hole $V_1$, the second hole $V_2$ and the third hole $V_3$, the interconnect structure 62*a* is electrically connected to both the first metal layer 43 and the second metal layer 53.

As shown in FIGS. 15 and 16, a section of the interconnect structure received in the laterally-extending (parallel to the second die) second hole $V_2$ provides greater flexibility in metal layer distribution of a subsequently-stacked die because electrical connection can be easily established between the die and the section.

In summary, the present invention provides a method of bonding first die(s) to a wafer and a die-stack structure. The method includes: providing a first layer of first die(s), which include(s) N first die(s) each including a first metal layer; providing the wafer, which includes a second metal layer; bonding the first die(s) to the wafer; forming an insulating layer and hole(s), the insulating layer covering the wafer around the first die(s) or filling gap(s) between the first die(s), the hole(s) formed in the insulating layer around the first die(s); forming interconnect structure(s) in the hole(s), the first metal layer, the second metal layer and the interconnect structure(s) are electrically connected, thus establishing electrical connection between the first die(s) and the wafer. In this method, it is unnecessary to form TSV(s) within the first die(s), reducing difficulties in the design of internal wiring within the first die(s) and resulting in area savings of the first die(s). The absence of TSV(s) circumvents issues associated with electrical connection between substrate(s) and TSV(s) (e.g., insulation, parasitic capacitance, etc.). Further, process complexity can be reduced because it is not necessary to take into account the influence of thickness variation of the first die(s) on the formation of through hole(s) by etching.

The embodiments disclosed herein are described in a progressive manner with the description of each embodiment focusing on its differences from others, and reference can be made between the embodiments for their identical or similar parts. Since the structure embodiments correspond to the method embodiments, they are described relatively briefly, and reference can be made to the method embodiments for details in the structure embodiments.

The foregoing description presents merely preferred embodiments of the present invention and is not intended to limit the scope of the present invention in any way. Any and all changes and modifications made by those of ordinary skill in the art in light of the above teachings without departing from the spirit of the present invention are intended to be embraced in the scope as defined by the appended claims.

The invention claimed is:

1. A method of bonding first die(s) to a wafer, comprising:

providing a first layer of first die(s), the first layer of first die(s) including N first die(s) each comprising a first substrate, a first dielectric layer on the first substrate and a first metal layer embedded in the first dielectric layer, where N is an integer≥1;

providing the wafer, which comprises a second metal layer;

bonding the N first die(s) to the wafer, wherein when N≥2, the N first dies are spaced apart on the wafer;

forming an insulating layer and a hole, wherein when N=1, the insulating layer covers a top surface of the single first die and the wafer around the single first die; when N≥2, the insulating layer covers top surfaces of the N first dies and fills gap(s) between the N first dies on the wafer; N=1 or N≥2, and a top surface of the insulating layer on the wafer is higher than the top surface(s) of the first die(s); and the hole comprises a first hole, which extends through the insulating layer and a partial thickness of the wafer and exposes the second metal layer; and forming an interconnect structure, which is filled in the hole, the first metal layer, the second metal layer and the interconnect structure are electrically connected, wherein the interconnect structure is in direct electrical contact with the first metal layer or the second metal layer.

2. The method of bonding first die(s) to a wafer of claim 1, wherein the formation of the insulating layer and the hole comprises:

forming the insulating layer; and etching the insulating layer and a partial thickness of the wafer until the second metal layer is exposed, thereby forming the first hole, wherein the hole comprises only the first hole.

3. The method of bonding first die(s) to a wafer of claim 1, wherein the hole further comprises a second hole, the second hole extending parallel to the wafer, the second hole connecting with the first hole, and the second hole located at least partially above the respective first die.

4. The method of bonding first die(s) to a wafer of claim 3, wherein the formation of the insulating layer and the hole comprises:

forming the insulating layer;

forming the second hole by etching a portion of the insulating layer higher than the top surface(s) of the first die(s); and forming the first hole by etching the insulating layer above the wafer exposed in the second hole and a partial thickness of the wafer, the first hole exposing the second metal layer.

5. The method of bonding first die(s) to a wafer of claim 3, wherein the insulating layer comprises a first insulating layer and a second insulating layer, wherein the formation of the insulating layer and the hole comprises:

forming the first insulating layer, which is arranged on the wafer; performing a chemical mechanical polishing process on a top surface of the first insulating layer until the top surface of the first insulating layer is flush with the top surface(s) of the first die(s);

forming the first hole, which extends through the first insulating layer and a partial thickness of the wafer and exposes the second metal layer;

forming a filling layer in the first hole;

forming the second insulating layer, which covers the first die(s), the filling layer and the first insulating layer; and forming the second hole by etching the second insulating layer.

6. The method of bonding first die(s) to a wafer of claim 3, wherein a side of the first die(s) which is proximate the first metal layer is bonded to the wafer, the first metal layer is electrically connected to the second metal layer.

7. The method of bonding first die(s) to a wafer of claim 6, wherein the interconnect structure is electrically connected to the second metal layer.

8. The method of bonding first die(s) to a wafer of claim 6, wherein after the formation of the interconnect structure, the method further comprising forming a lead-out layer, the formation of the lead-out layer comprising:

forming a separation layer, which covers the interconnect structure and the insulating layer;

forming a lead-out hole, which extends through the separation layer and exposes the interconnect structure; and filling the lead-out layer in the lead-out hole, the lead-out layer is electrically connected to the interconnect structure.

9. The method of bonding first die(s) to a wafer of claim 8, further comprising:

providing an M-th layer of first die(s), where M is an integer ≥2, and repeating the steps for forming the insulating layer, the hole, the interconnect structure, the separation layer and the lead-out layer of the first layer of first die(s) to form an insulating layer, hole, interconnect structure, a separation layer and a lead-out layer of the M-th layer of first die(s), the insulating layer of the M-th layer of first die(s) covering a separation layer of an (M−1)-th layer of first die(s);

bonding the separation layer of the M-th layer of first die(s) to the separation layer of the (M−1)-th layer of first die(s), wherein a metal layer of the M-th layer of first die(s) is electrically connected to a lead-out layer of the (M−1)-th layer of first die(s).

10. The method of bonding first die(s) to a wafer of claim 3, wherein a side of the first die(s) which is proximate the first metal layer is bonded to the wafer.

11. The method of bonding first die(s) to a wafer of claim 10, wherein the hole further comprises a third hole connecting with the second hole, the third hole extending through a partial thickness of the first dielectric layer and exposing the first metal layer, wherein the interconnect structure is filled in the first hole, the second hole and the third hole.

12. The method of bonding first die(s) to a wafer of claim 10, wherein first alignment marks are formed in the first dielectric layer of the first die(s) and respective second alignment marks in the wafer, the first alignment marks aligned with the respective second alignment marks in a thickness direction of the first dies, wherein third alignment marks are formed in the insulating layer by exposure and development as replicas of the second alignment marks, the projections of the third alignment marks on the wafer coinciding with projections of the second alignment marks on the wafer.

13. The method of bonding first die(s) to a wafer of claim 11, wherein after the formation of the interconnect structure, the method further comprising forming an isolation layer, the isolation layer covering the interconnect structure and the insulating layer.

14. The method of bonding first die(s) to a wafer of claim 13, further comprising:

providing an L-th layer of first die(s), where L is an integer ≥2, and repeating the steps for forming the insulating layer, the hole, the interconnect structure and the isolation layer of the first layer of first die(s) to form an insulating layer, a hole, an interconnect structure and an isolation layer of the L-th layer of first die(s), the insulating layer of the L-th layer of first die(s) covering an isolation layer of an (L−1)-th layer of first die(s); and bonding the isolation layer of the L-th layer of first die(s) to the isolation layer of the (L−1)-th layer of first die(s), wherein a metal layer of the L-th layer of first die(s) is brought into contact with and electrically connected to an interconnect structure of the (L−1)-th layer of first die(s).

15. The method of bonding first die(s) to a wafer of claim 1, wherein after the formation of the interconnect structure, the method further comprising forming a lead-out layer, the formation of the lead-out layer comprising:

forming a separation layer, which covers the interconnect structure and the insulating layer;

forming a lead-out hole, which extends through the separation layer and exposes the interconnect structure; and filling the lead-out layer in the lead-out hole, the lead-out layer is electrically connected to the interconnect structure.

16. A die-stack structure, comprising:

a first die comprising a first substrate, a first dielectric layer on the first substrate and a first metal layer embedded in the first dielectric layer;

a second die comprising a metal layer, the second die having an area larger than an area of the first die, the second die bonded to the first die;

an insulating layer and a hole, the insulating layer covering a top surface of the first die and the second die around the first die, the insulating layer having a top surface above the second die that is higher than a top surface of the first die, the hole including a first hole, which extends through the insulating layer and a partial thickness of the second die and exposes the second metal layer; and an interconnect structure filled in the hole, the first metal layer, the second metal layer and the interconnect structure are electrically connected.

17. The die-stack structure of claim 16, wherein the hole further comprises a second hole, the second hole extending parallel to the first die, the second hole connecting with the first hole, and the second hole at least partially located above the first die.

18. The die-stack structure of claim 17, wherein a side of the first die which is proximate the first metal layer is bonded to the second die, the first metal layer is electrically connected to the second metal layer.

19. The die-stack structure of claim 18, further comprising:

a separation layer covering the interconnect structure and the insulating layer;

a lead-out hole extending through the separation layer and exposing the interconnect structure; and a lead-out layer filled in the lead-out hole and electrically connected to the interconnect structure.

20. The die-stack structure of claim 17, wherein a side of the first die away from the first metal layer is bonded to the second die.

21. The die-stack structure of claim 20, wherein the hole further comprises a third hole connecting with the second hole, the third hole extending through a partial thickness of the first dielectric layer and exposing the first metal layer, wherein the interconnect structure is filled in the first hole, the second hole and the third hole.

* * * * *